(12) United States Patent
Signorini et al.

(10) Patent No.: US 12,394,726 B2
(45) Date of Patent: *Aug. 19, 2025

(54) METHOD TO IMPLEMENT WAFER-LEVEL CHIP-SCALE PACKAGES WITH GROUNDED CONFORMAL SHIELD

(71) Applicant: Intel Corporation, Santa Clara, CA (US)

(72) Inventors: Gianni Signorini, Garching bei Muenchen (DE); Georg Seidemann, Landshut (DE); Bernd Waidhas, Pettendorf (DE)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/397,898

(22) Filed: Dec. 27, 2023

(65) Prior Publication Data

US 2024/0128202 A1     Apr. 18, 2024

Related U.S. Application Data

(63) Continuation of application No. 16/368,032, filed on Mar. 28, 2019, now Pat. No. 12,080,655.

(51) Int. Cl.
*H01L 23/552* (2006.01)
*H01L 21/48* (2006.01)
(Continued)

(52) U.S. Cl.
CPC ........ *H01L 23/552* (2013.01); *H01L 21/4853* (2013.01); *H01L 21/4857* (2013.01); *H01L 21/78* (2013.01); *H01L 23/3114* (2013.01); *H01L 23/49816* (2013.01); *H01L 23/49822* (2013.01); *H01L 23/49838* (2013.01)

(58) Field of Classification Search
None
See application file for complete search history.

(56) References Cited

U.S. PATENT DOCUMENTS 9,391,046 B2 * 7/2016 Park ..................... H01L 24/17
9,685,403 B2 * 6/2017 Pagaila ............ H01L 23/49838
(Continued)

OTHER PUBLICATIONS

Office Action from U.S. Appl. No. 16/368,032, mailed Mar. 12, 2024, 6 pgs.
(Continued)

*Primary Examiner* — Long Pham
(74) *Attorney, Agent, or Firm* — Schwabe, Williamson & Wyatt P.C.

(57) ABSTRACT

Embodiments disclosed herein include electronic packages with conformal shields and methods of forming such packages. In an embodiment, the electronic package comprises a die having a first surface, a second surface opposite the first surface, and sidewall surfaces. A redistribution layer is over the first surface of the die, and the redistribution layer comprises a first conductive layer. In an embodiment, an under ball metallization (UBM) layer is over the redistribution layer, and a conductive shield is over the sidewall surfaces of the die and the second surface of the die. In an embodiment, the conductive shield is electrically coupled to the UBM layer.

20 Claims, 10 Drawing Sheets

(51) Int. Cl.
    *H01L 21/78*     (2006.01)
    *H01L 23/31*     (2006.01)
    *H01L 23/498*    (2006.01)

(56) References Cited

U.S. PATENT DOCUMENTS

| | | | |
|---|---|---|---|
| 9,859,229 B2 * | 1/2018 | Tsai | H01L 25/50 |
| 10,381,313 B2 * | 8/2019 | Kim | H01L 24/73 |
| 11,094,645 B2 * | 8/2021 | Kim | H01L 21/6835 |
| 12,080,655 B2 * | 9/2024 | Signorini | H01L 21/4853 |
| 2012/0292745 A1 | 11/2012 | Park | |

OTHER PUBLICATIONS

Notice of Allowance from U.S. Appl. No. 16/368,032, mailed May 9, 2024, 7 pgs.

\* cited by examiner

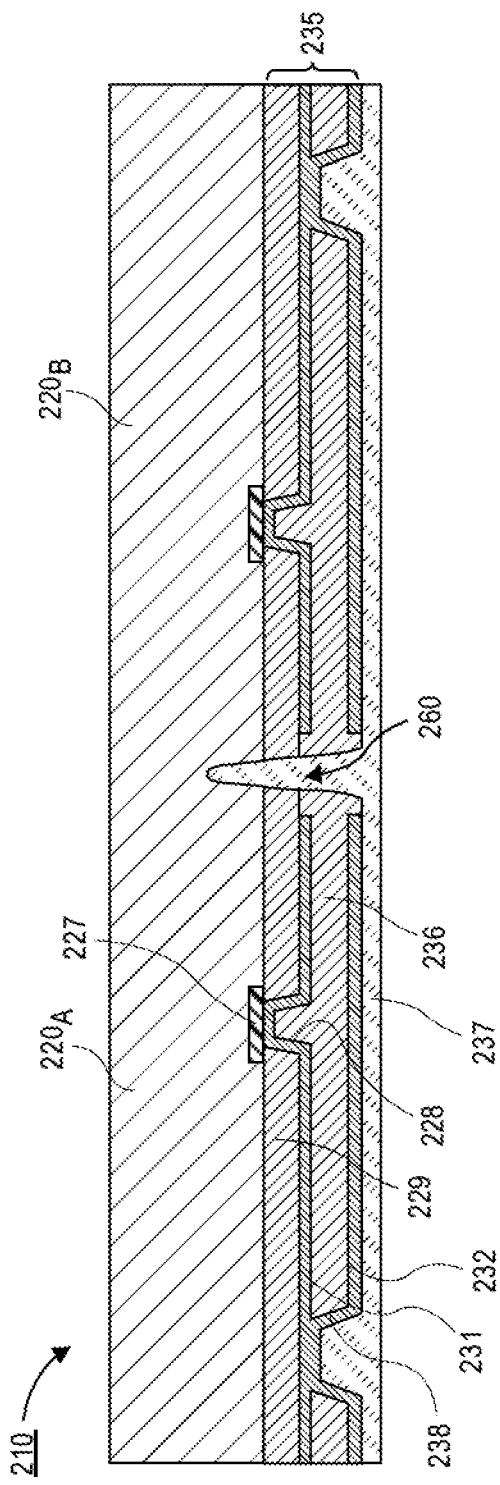
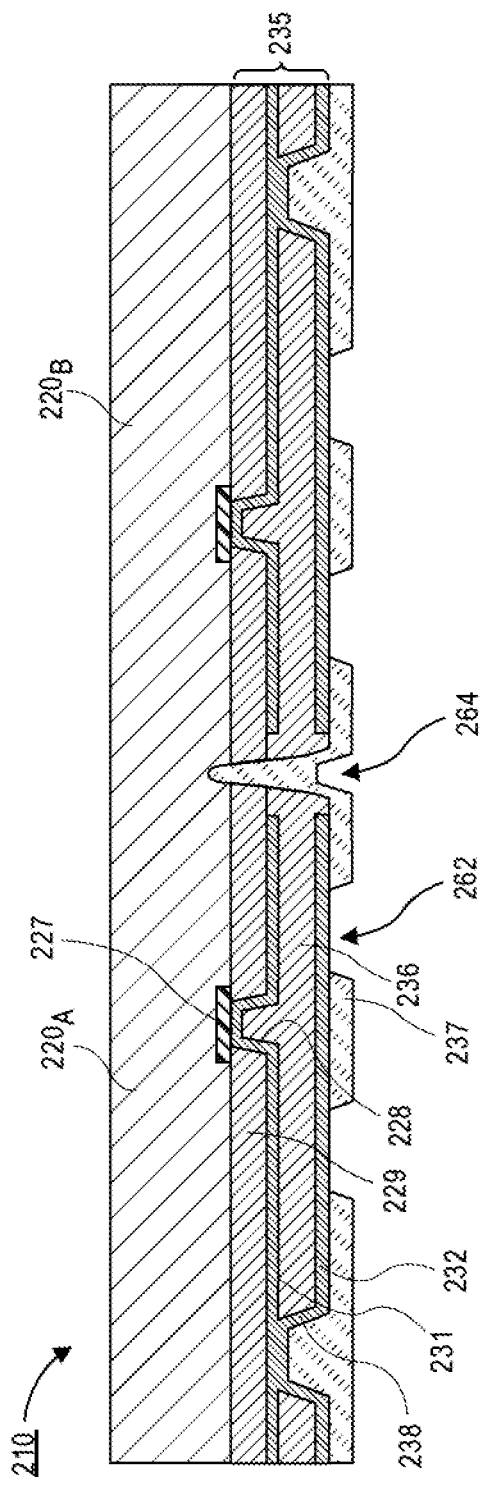
FIG. 2C
FIG. 2D

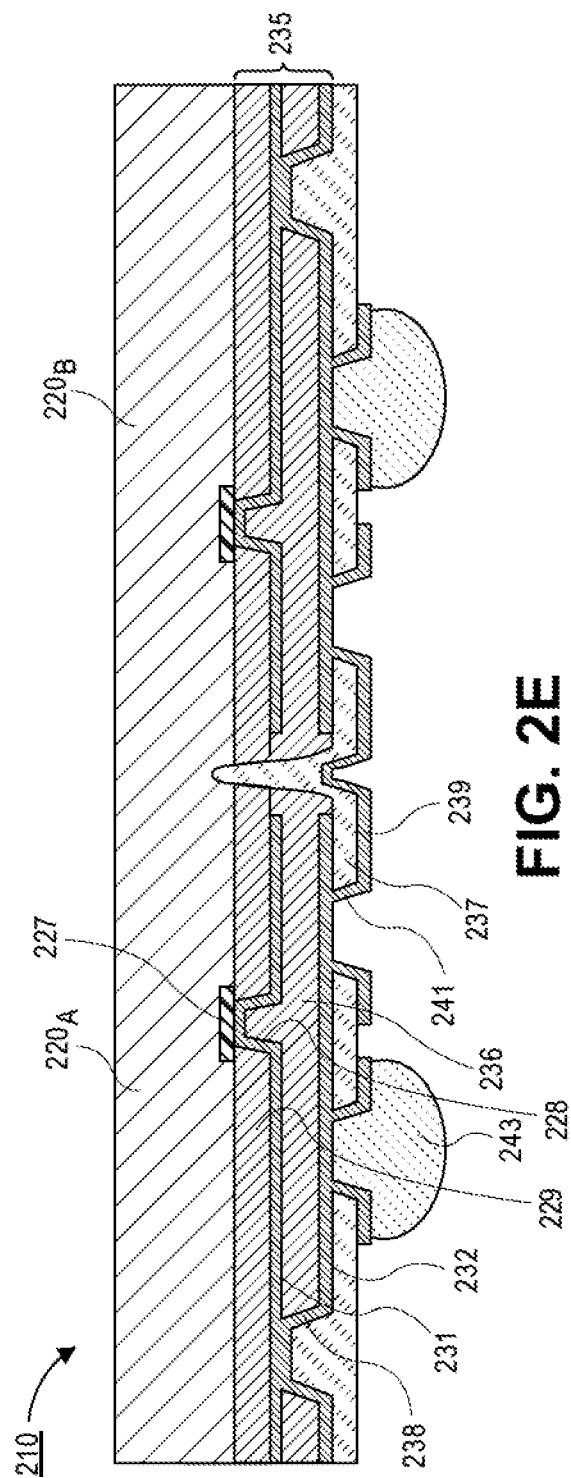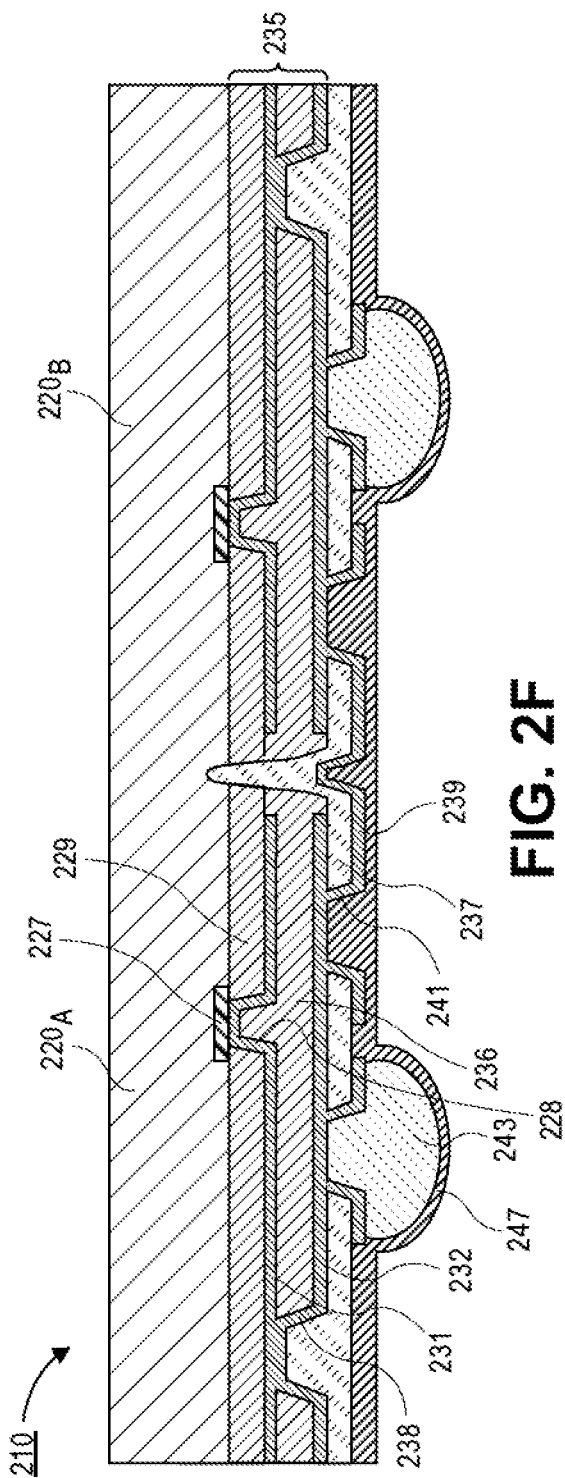

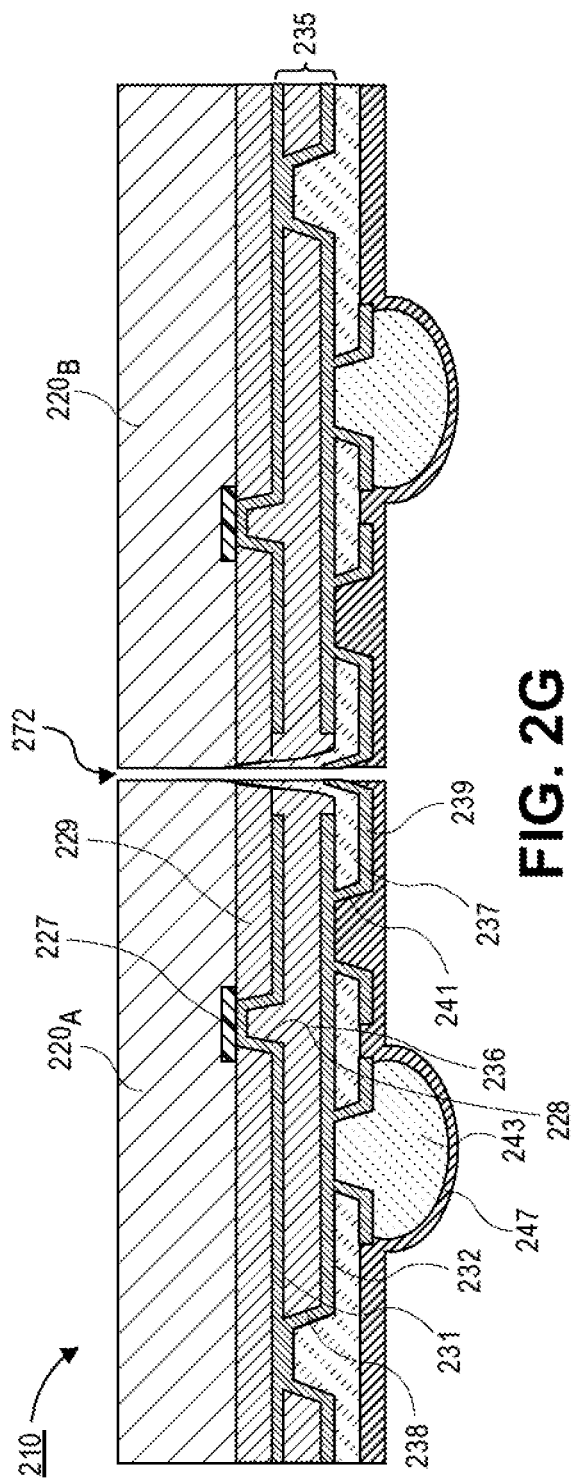
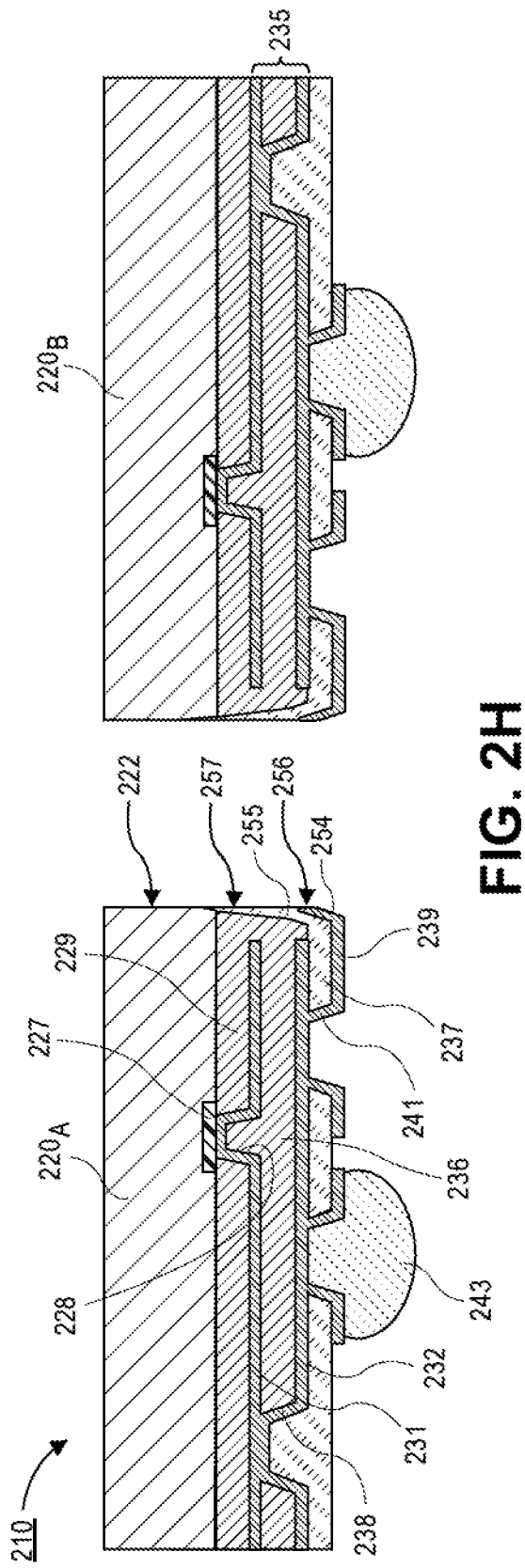

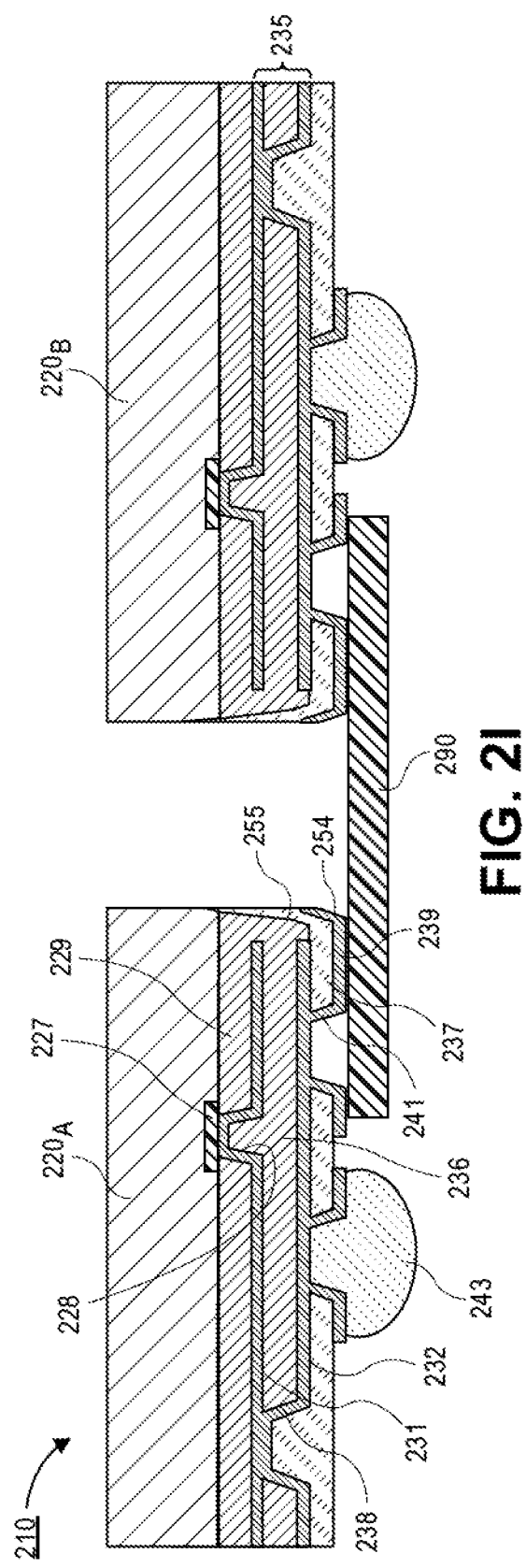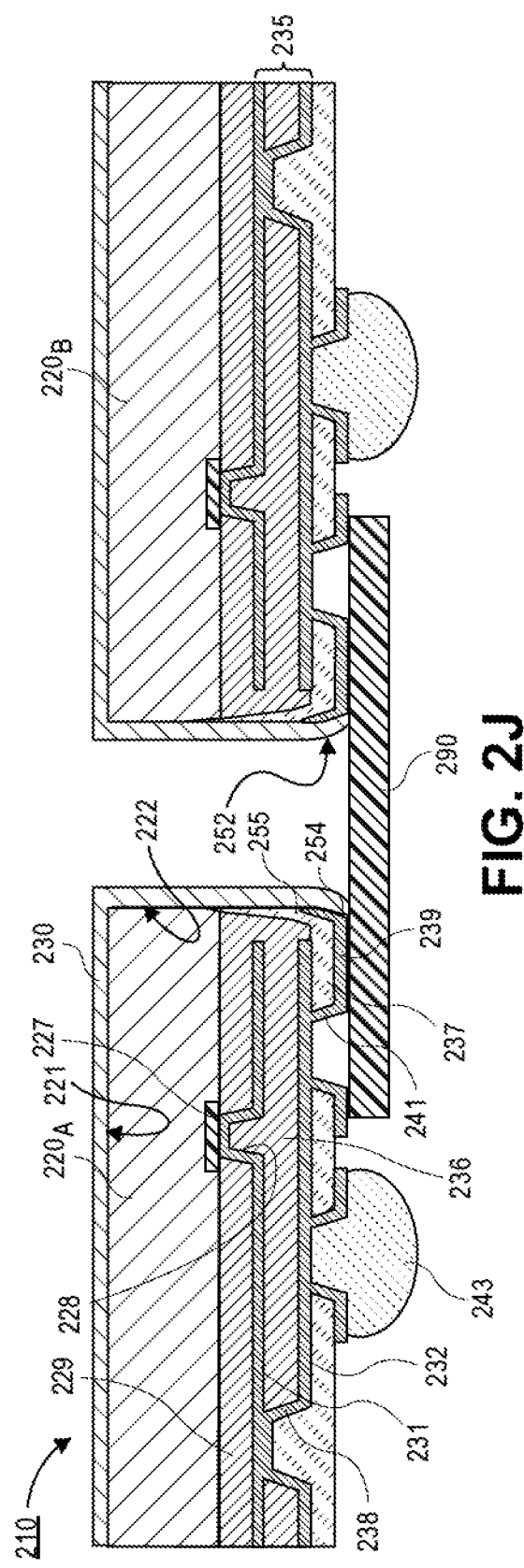

METHOD TO IMPLEMENT WAFER-LEVEL CHIP-SCALE PACKAGES WITH GROUNDED CONFORMAL SHIELD

CROSS-REFERENCE TO RELATED APPLICATIONS

This application is a continuation of U.S. patent application Ser. No. 16/368,032, filed on Mar. 28, 2019, the entire contents of which is hereby incorporated by reference herein.

TECHNICAL FIELD

Embodiments of the present disclosure relate to electronic packaging, and more particularly, to a grounded conformal shield around a wafer-level chip-scale package (WLCSP).

BACKGROUND

Electro-magnetic interferences (EMI) are of specific concern in highly-integrated radio frequency (RF) systems. EMI can create interferences and introduce performance degradation across different RF components. Proper countermeasures are required to reduce EMI. Standard methods rely on the installation of thick metal shields that encapsulate the entire RF portions of the system (packaged semiconductor devices and discrete components). Such metal cage shields are connected to printed circuit board (PCB) ground metals. PCB metal cage shields are effective and can significantly reduce EMI. However, the installation of such components requires additional manufacturing steps, costs, and area and/or volume (due to their thickness and due to space required for their soldering to the PCB metals).

In order to save PCB area and/or volume, recent technology developments have enabled the realization of sputtered metal sheets on the four sidewalls and the top surface of electronic semiconductor packages. Such processes implement the so-called "conformal shield", and have been applied in flip-chip (FC) semiconductor packages.

In FC semiconductor package technology, the side conformal shields are connected to the package ground metals. Ground metals extend until the outer edges of each package substrate layer. The contact of these outer edges with the side conformal shields provide grounded connection to the entire EMI shield (i.e., "grounding").

While the conformal shielding has been proposed for FC architectures, it is currently not possible to implement such architectures with wafer-level chip-scale packages (WLCSP). In WLCSP architectures, the metals of the redistribution layer are confined to a region of the die that is smaller than the die area. That is, metal layers of the redistribution layer do not extend to the edge of the package. Accordingly, a conformal shield applied to the WLCSP structure will not have access to metals of the redistribution layer, and therefore, a conformal shield cannot be grounded.

BRIEF DESCRIPTION OF THE DRAWINGS

FIG. 2C is a cross-sectional illustration after a dielectric layer is disposed over the redistribution layers and into the groove, in accordance with an embodiment.

FIG. 2D is a cross-sectional illustration after openings are disposed into the groove, in accordance with the embodiment.

FIG. 2E is a cross-sectional illustration after an under bump ball metallization and solder balls are disposed, in accordance with an embodiment.

FIG. 2F is a cross-sectional illustration after a protection layer is disposed over the solder balls and the under bump ball metallization layer, in accordance with an embodiment.

FIG. 2G is a cross-sectional illustration after the first die and the second die are singulated, in accordance with an embodiment.

FIG. 2H is a cross-sectional illustration after the protection layer is removed, in accordance with an embodiment.

FIG. 2I is a cross-sectional illustration after the first die and the second die are placed on a carrier, in accordance with an embodiment.

FIG. 2J is a cross-sectional illustration after a conformal shield is disposed over surfaces of the first die and the second die, in accordance with an embodiment.

EMBODIMENTS OF THE PRESENT DISCLOSURE

Described herein are a grounded conformal shield around a wafer-level chip-scale packages (WLCSP) and methods of forming such electronic packages, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, current wafer-level chip-scale (WLCSP) architectures are not compatible with conformal shielding structures due to the lack of a connection point to grounded metal layers in the redistribution layer. Accordingly, embodiments disclosed herein include WLCSP architectures that include a conductive layer that extends to the edge of the package. This conductive layer is exposed during the deposition of the conformal shield and enables the shield to be grounded. Accordingly, embodiments disclosed herein provide excelled EMI shielding for WLCSP architectures.

Furthermore, since the thickness of the conformal shield is minimal (e.g., between approximately 2 µm and 5 µm), the increase in Z-height needed to provide shielding is not significant, particularly with respect to the thicknesses needed for handling and mounting PCB metal cages. Additionally, since the conformal shield is grounded via a path through the WLCSP, there is no need for direct soldering the conformal shield to the PCB, as is the case with PCB metal cages described above. Therefore, excellent EMI shielding for WLCSP architectures is provided without the area and/or volume penalties associated with PCB metal cages.

Figure 1A:
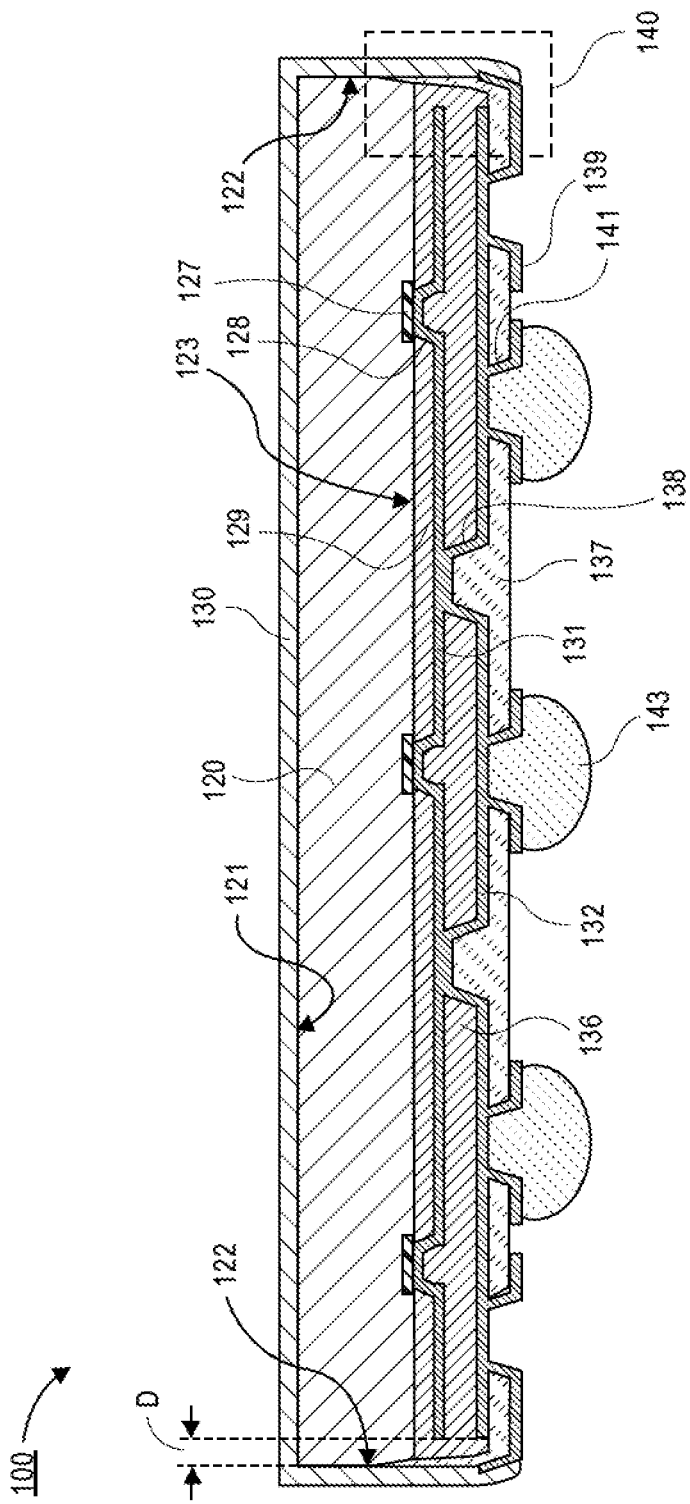
FIG. 1A is a cross-sectional illustration of a wafer-level chip-scale package (WLCSP) with a grounded conformal shield, in accordance with an embodiment.

Referring now to FIG. 1A, a cross-sectional illustration of an electronic package 100 is shown, in accordance with an embodiment. In an embodiment, the electronic package comprises a die 120. The die 120 may be any suitable die. For example, the die 120 may include circuitry for RF communications. That is, the die 120 may be a transceiver die, or the like. However, it is to be appreciated that other types of dies 120 (e.g., processors, memories, etc.) may also be shielded with substantially similar architectures. In an embodiment, the die 120 comprises a first surface 123, a second surface 121 opposite from the first surface 123, and sidewall surfaces 122. In an embodiment, pads 127 for the die 120 may be positioned along the first surface 123.

In an embodiment, a redistribution layer may be positioned over the first surface 123 of the die 120. The redistribution layer may comprise a first dielectric layer 129 over the first surface 123, a first conductive layer 131, and a second conductive layer 132. The first conductive layer 131 may be electrically coupled to pads 127 by vias 128 through the first dielectric layer 129. The first conductive layer 131 may be separated from the second conductive layer 132 by a second dielectric layer 136. In an embodiment, one or more vias 138 may pass through the second dielectric layer 136 to provide electrical connections between the first conductive layer 131 and the second conductive layer 132.

In an embodiment, the first conductive layer 131 and the second conductive layer 132 may include ends that are spaced away from sidewall surfaces 122 of the die 120. For example, the first conductive layer 131 and the second conductive layer 132 may be spaced a distance D from the edge of the die 120. Restricting the first conductive layer 131 and the second conductive layer 132 from extending to the edge of the die 120 allows for laser grooving needed to singulate the die 120. The singulation process (including laser grooving) will be described in greater detail below.

In an embodiment, a third conductive layer 139 may be positioned over the redistribution layer. In some embodiments, the third conductive layer 139 may be referred to as an under ball metallization layer (UBM). That is, the third conductive layer 139 may be contacted by ball 143 (e.g., solder ball or the like). In an embodiment, the third conductive layer 139 may be separated from the second conductive layer 132 by a third dielectric layer 137. Vias 141 may extend through the third dielectric layer 137 to provide electrical connections between the third conductive layer 139 and the second conductive layer 132.

In an embodiment, a conductive shield 130 may be formed over the electronic package 100. For example, the conductive shield 130 may conform to the sidewall surfaces 122 and the second surface 121 of the die 120. The conductive shield 130 may be electrically coupled to the third conductive layer 139 (which in turn is electrically coupled to a feature (e.g., a solder ball 143) that is held at ground potential. Accordingly, the conductive shield 130 may be grounded, and therefore, provides excellent EMI shielding to the electronic package 100. In an embodiment, the connection between the conductive shield 130 and the third conductive layer 139 may be located along edge regions 140 of the electronic package 100.

Figure 1B:
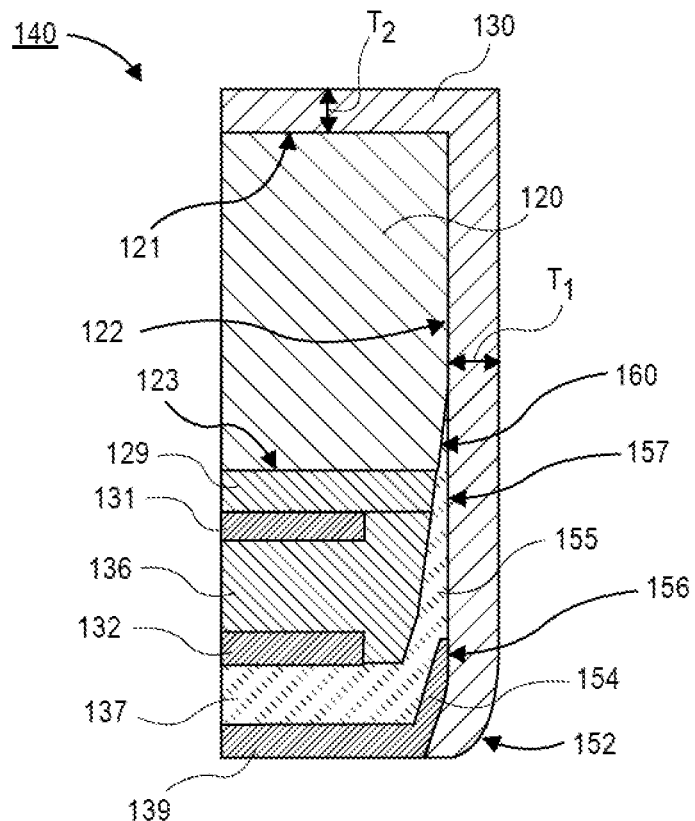
FIG. 1B is a cross-sectional illustration of a portion of the WLCSP in FIG. 1A that more clearly illustrates the grounding connection to the conformal shield, in accordance with an embodiment.

Referring now to FIG. 1B, a cross-sectional illustration more clearly illustrates the edge regions 140 of the electronic package 100. As shown, the third conductive layer 139 wraps around the corner of the edge region 140. Particularly, a portion 154 of the third conductive layer 139 extends towards the die 120. In an embodiment, the portion 154 may have a non-vertical orientation. For example, the portion 154 may extend in the Z-direction at a non-orthogonal angle. Furthermore, a surface 156 of the third conductive layer 139 may be substantially coplanar with a sidewall surface 122 of the die 120. In an embodiment, the portion 154 of the third conductive layer 139 may be in direct contact with the conductive shield 130.

In an embodiment, a portion 155 of the third dielectric layer 137 may also extend towards the die 120. As shown, the third dielectric layer 137 wraps around the sidewall surface of the second dielectric layer 136 and the first dielectric layer 129 and passes through a thickness of the first dielectric layer 129 and the second dielectric layer 136. That is, the portion 155 of the third dielectric layer 137 may extend past (in the Z-direction) the first conductive layer 131 and the second conductive layer 132. Furthermore, edges of the first conductive layer 131 and the second conductive layer 132 may be separated from the conductive shield 130 by portions of the second dielectric layer 136 and the portion 155 of the third dielectric layer 137.

In some embodiments, the portion 155 of the third dielectric layer 137 may also extend into a groove 160 of the die 120. The groove 160 may pass through back-end-of-line (BEOL) layers (not shown) of the die 120. In some embodiments, the groove 160 may extend into the semiconductor substrate of the die 120. That is, in some embodiments, the portion 155 of the third dielectric layer 137 may directly contact the die 120. In some embodiments, a surface 157 of the third dielectric layer 137 may be substantially coplanar with the sidewall surface 122 of the die 120. In an embodiment, the portion 155 of the third dielectric layer 137 may also directly contact the conductive shield 130.

In an embodiment, the conductive shield 130 may be conformally disposed over surfaces of the electronic package 100. For example, the conductive shield 130 may be deposited with a sputtering process, a chemical vapor deposition (CVD) process, or the like. In some embodiments, a first thickness $T_1$ of the conductive shield 130 along sidewall surfaces 122 of the die 120 may be different than a second thickness $T_2$ of the conductive shield along the second surface 121 of the die 120. For example, the first thickness $T_1$ may be smaller than the second thickness $T_2$ (e.g., the first thickness $T_1$ may be approximately 2-3 µm and the second thickness $T_2$ may be approximately 5 µm or greater). In other embodiments, the first thickness $T_1$ and the second thickness $T_2$ of the conductive shield 130 may be substantially uniform (e.g., when a CVD deposition process is used). In an embodiment, the minimum thickness of the conductive shield 130 may be determined by the bandwidth of the EMI of interest. In high frequency applications (e.g., suitable for 5G communications), the minimum thickness of the conductive shield 130 may be approximately 2 µm or greater. The minimal thickness required for the conductive shield 130 provides a reduction in the Z-height of the electronic package 100 compared to PCB metal cages, such as those disclosed above.

The conformal nature of the conductive shield 130 provides a substantial matching of the profile of exposed surfaces. Accordingly, when the portion 154 of the third conductive layer 139 extends upwards at a non-orthogonal angle, the profile may be preserved by the conductive shield 130. For example, conductive shield 130 comprises a curved profile 152 proximate to the portion 154 of the third conductive layer 139.

Figure 1C:
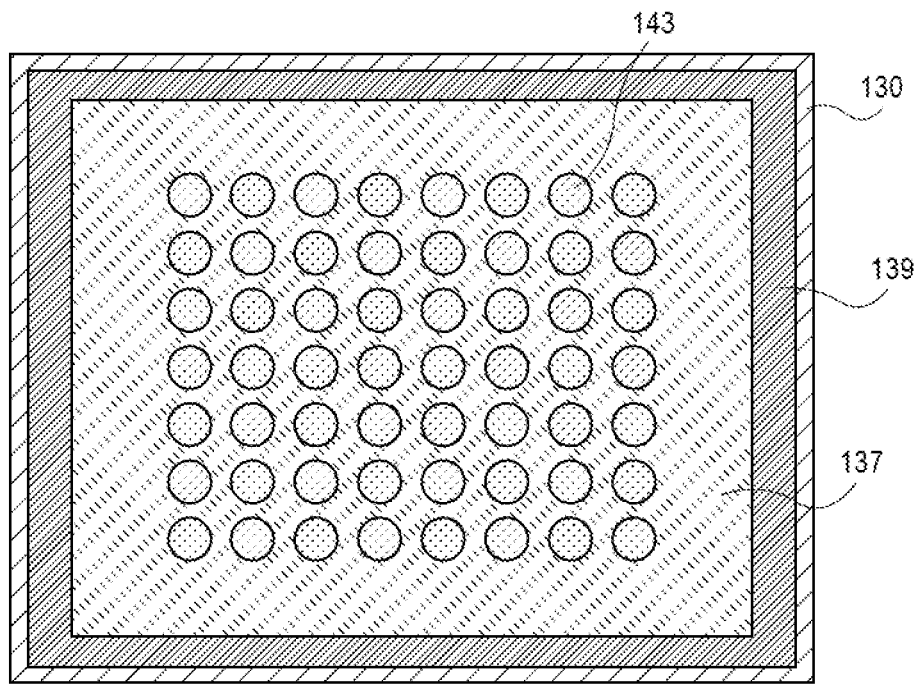
FIG. 1C is a plan view illustration of a WLCSP with a grounded conformal shield, in accordance with an embodiment.

Referring now to FIG. 1C, a plan view illustration of the electronic package 100 (viewed from below) is shown, in accordance with an embodiment. As shown, the third conductive layer 139 may form a ring around the perimeter of the electronic package 100. Accordingly, the conductive shield 130 has a relatively large interface with features held at ground potential. This provides excellent EMI shielding for the electronic package 100. In other embodiments, the third conductive layer 139 comprises a partial ring or only one or some traces.

Referring now to FIGS. 2A-2J, a series of cross-sectional illustrations depicting a process for fabricating a WLCSP with a conductive shield, is shown, in accordance with an embodiment.

Figure 2A:
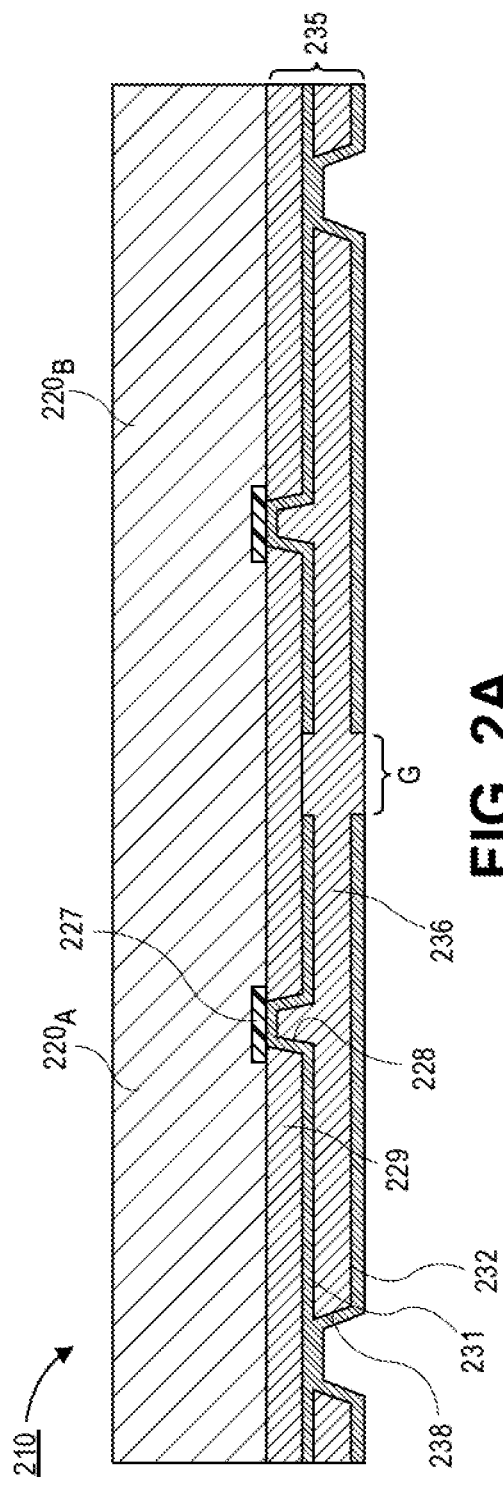
FIG. 2A is a cross-sectional illustration of a wafer with a first die, a second die, a first redistribution layer, and a second redistribution layer, in accordance with an embodiment.

Referring now to FIG. 2A, a cross-sectional illustration of a substrate 210 with a plurality of dies 220 and a redistribution layer 235 is shown, in accordance with an embodiment. In an embodiment, the substrate 210 may comprise any number of dies 220 that are fabricated on the substrate. For example, a first die $220_A$ is on the left side of the substrate 210 and a second die $220_B$ is on the right side of the substrate 210. In the illustrated embodiment, no discernable boundary is shown between the first die $220_A$ and the second die $220_B$, though it is to be appreciated that each die $220_A$ and $220_B$ are discrete components fabricated into (or on) a single substrate 210. In an embodiment, each die 220 may comprise active device circuitry on a semiconductor substrate and BEOL layers (not shown).

In an embodiment, a redistribution layer 235 may be positioned over a surface of the substrate 210. The redistribution layer 235 may comprise a first dielectric layer 229 over the dies 220 and the die pads 227. In an embodiment, the redistribution layer 235 may further comprise a first conductive layer 231 and a second conductive layer 232. The first conductive layer 231 may be over the first dielectric layer 229, and the first conductive layer 231 may be separated from the second conductive layer 232 by a second dielectric layer 236. In an embodiment, one or more vias 238 may pass through the second dielectric layer 236 to provide electrical connections between the first conductive layer 231 and the second conductive layer 232, and one or more vias 228 may pass through the first dielectric layer 229 to provide electrical connections between the pad 227 and the first conductive layer 231.

In an embodiment, the first conductive layer 231 and the second conductive layer 232 may comprise a gap G. The gap G may be located below the boundary between the first die $220_A$ and the second die $220_B$. In an embodiment, the gap G provides a portion of the redistribution layer 235 that is free from conductive material. Accordingly, a laser ablation process may be used in a subsequent processing operation to form a first groove.

Figure 2B:
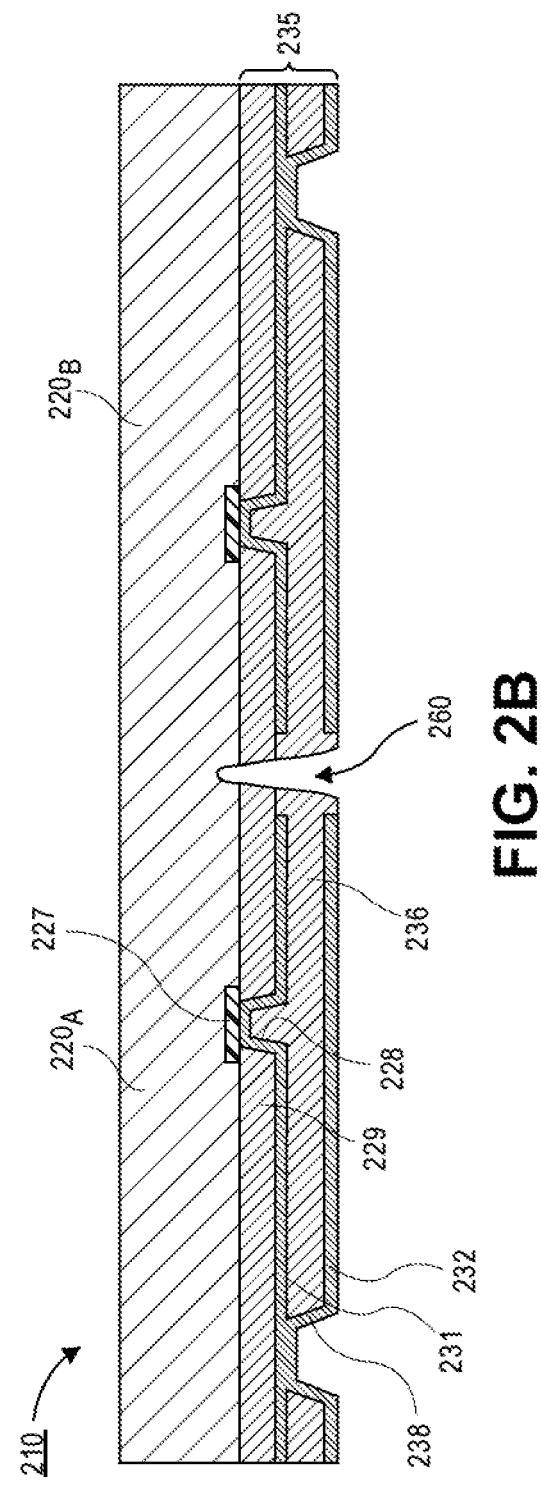
FIG. 2B is a cross-sectional illustration after a groove is formed through the redistribution layers and into the wafer between the first die and the second die.

Referring now to FIG. 2B, a cross-sectional illustration of the substrate 210 after a first groove 260 is formed through the redistribution layer 235 and into the substrate 210 between the first die $220_A$ and the second die $220_B$ is shown, in accordance with an embodiment. In an embodiment, the first groove 260 may be fabricated with a laser ablation process. The first groove 260 may pass through the redistribution layer 235 and extend at least into the BEOL layers between the first die $220_A$ and the second die $220_B$. In some embodiments, the first groove 260 may pass entirely through the BEOL layers.

Referring now to FIG. 2C, a cross-sectional illustration of the substrate 210 after a third dielectric layer 237 is disposed is shown, in accordance with an embodiment. In an embodiment, the third dielectric layer 237 may cover the second conductive layer 232 and fill any via openings. In an embodiment, the third dielectric layer 237 fills the first groove 260.

Referring now to FIG. 2D, a cross-sectional illustration after the third dielectric layer 237 is patterned is shown, in accordance with an embodiment. In an embodiment, the patterning may comprise the formation of via openings 262 through the second dielectric layer 237. In an embodiment, the patterning may also comprise the formation of a second groove 264 over the first groove 260. In some embodiments, the third dielectric layer 237 does not completely fill the groove 260, and there may be no further need to pattern a second groove 264. That is, the second groove 264 will naturally form during deposition of the third dielectric layer 237.

Referring now to FIG. 2E a cross-sectional illustration after a third conductive layer 239 and balls 243 are disposed is shown, in accordance with an embodiment. In an embodiment, the third conductive layer 239 may be disposed along surfaces of the via openings 262 to form vias 241 and may also be disposed along the surfaces of the second groove 264. In an embodiment, the second groove 264 may comprise a tapered profile. Accordingly, the third conductive layer 239 may extend up towards the first substrate 210 at a non-orthogonal angle.

In an embodiment, ball 243 may be disposed over the third conductive layer 239. For example, the ball 243 may comprise solder ball 243. In some embodiments, the third conductive layer 239 may be referred to as an under ball metallization (UBM) layer since the third conductive layer 239 provides the contact surface for the ball 243. In an embodiment, one or more of the ball 243 may be designated as a ground ball. That is, during operation, the ground ball 243 do not pass signals and are maintained at ground potential.

Referring now to FIG. 2F, a cross-sectional illustration after a protection layer 247 is disposed over exposed surfaces is shown, in accordance with an embodiment. The protection layer 247 may be a dielectric layer. Particularly, the protection layer 247 provides protection to the surfaces from a subsequent singulation process and to avoid corrosion. In an embodiment, the protection layer 247 is disposed over the third conductive layer 239, the third dielectric layer 237, and the ball 243. In some embodiments, the protection layer 247 may optionally be omitted.

Referring now to FIG. 2G, a cross-sectional illustration after a singulation operation is shown, in accordance with an embodiment. In an embodiment, the singulation may be implemented by forming a trench 272 through the substrate 210, the redistribution layer 235, the third dielectric layer 237, the third conductive layer 239, and the protection layer 247. In an embodiment, the singulation process may be implemented with a sawing operation (e.g., a mechanical sawing operation). In an embodiment, the singulation operation may be implemented before grinding of the substrate 210 (e.g., dice before grinding (DBG)) or after grinding the substrate 210. However, it is to be appreciated that embodiments include the use of a grooving process (i.e., to form the groove 260) in addition to the singulation operation in order to provide structures such as those disclosed herein.

Referring now to FIG. 2H, a cross-sectional illustration after the protection layer 247 is removed is shown, in accordance with an embodiment. In the illustrated embodiment, the protection layer 247 is entirely removed. However, it is to be appreciated that the protection layer may remain in some locations (e.g., the protection layer may remain over vias 241 between the second conductive layer 232 and the third conductive layer 239).

As shown in FIG. 2H, the singulation provides a portion 255 of the third dielectric layer 237 that wraps around the first dielectric layer 229 and the second dielectric layer 236. That is, the portion 255 of the third dielectric layer 237 may extend through a thickness of the first dielectric layer 229 and the second dielectric layer 236 and past each of the first conductive layer 231 and the second conductive layer 232. In an embodiment, the portion 255 of the second dielectric layer 236 may have a surface 257 that is substantially coplanar with a sidewall surface 222 of the first die $220_A$. Additionally, a portion 254 of the third conductive layer 239 may extend upwards and have a surface 256 that is substantially coplanar with the sidewall surface 222 of the first die $220_A$. It is to be appreciated that the second die $220_B$ comprises a substantially mirror image of the first die $220_A$, and therefore, will not be explained in detail herein.

Referring now to FIG. 2I, a cross-sectional illustration after the first die $220_A$ and the second die $220_B$ are placed onto a carrier 290 is shown, in accordance with an embodiment. In an embodiment, the carrier 290 may comprise openings, through which the balls 243 may pass. For example, the first die $220_A$ and the second die $220_B$ may be supported on the carrier 290 by the third conductive layer 239. The carrier seals off the underside surface of the first die $220_A$ and the second die $220_B$ from subsequent deposition processes.

Referring now to FIG. 2J, a cross-sectional illustration after conductive shields 230 are disposed over exposed surfaces of the first die $220_A$ and the second die $220_B$ is shown, in accordance with an embodiment. In an embodiment, the conductive shields 230 may comprise any suitable conductive material (e.g., copper). In an embodiment the conductive shields may be deposited with a sputtering process, a CVD process, or any other suitable conformal deposition process. In an embodiment, a minimum thickness of the conductive shields 230 may be approximately 2 μm or greater. Accordingly, the increase in Z-height attributable to the conductive shield 230 is minimal.

In an embodiment, the conductive shield 230 is disposed over a second surface 221 (i.e., the backside surface) and over sidewall surfaces 222 of the first die $220_A$ and the second die $220_B$. That is, the conductive shield 230 covers five surfaces of the dies 220 (i.e., four sidewalls surfaces 222 and the second surface 221). In an embodiment, the conductive shield 230 may comprise a curved profile 252 proximate to the portion 254 of the third conductive layer 239.

In an embodiment, the conductive shield 230 is grounded. Particularly, the conductive shield 230 is electrically coupled to a ground ball 243 by the third conductive layer 239. In contrast to the first conductive layer 231 and the second conductive layer 232 (which do not extend to the edge of the device), the third conductive layer 239 provides an electrical path to the edge of the device. For example, the conductive shield 230 may be electrically coupled to the portion 254 of the third conductive layer 239 and the third conductive layer 239 may be electrically coupled to a ground ball 243. Accordingly, the conductive shield 230 may be grounded without the need to be directly soldered to the PCB, as is the case with PCB metal cages described above. As such, WLCSP architectures such as those described herein save space on the PCB.

In an embodiment, the conductive shield 230 may be separated from the first conductive layer 231 and the second conductive layer 232 by portions of the second dielectric layer 236 and a portion 255 of the third dielectric layer 237. In an embodiment, the portion 255 of the third dielectric layer 237 may extend up into the die 220.

Figure 3:
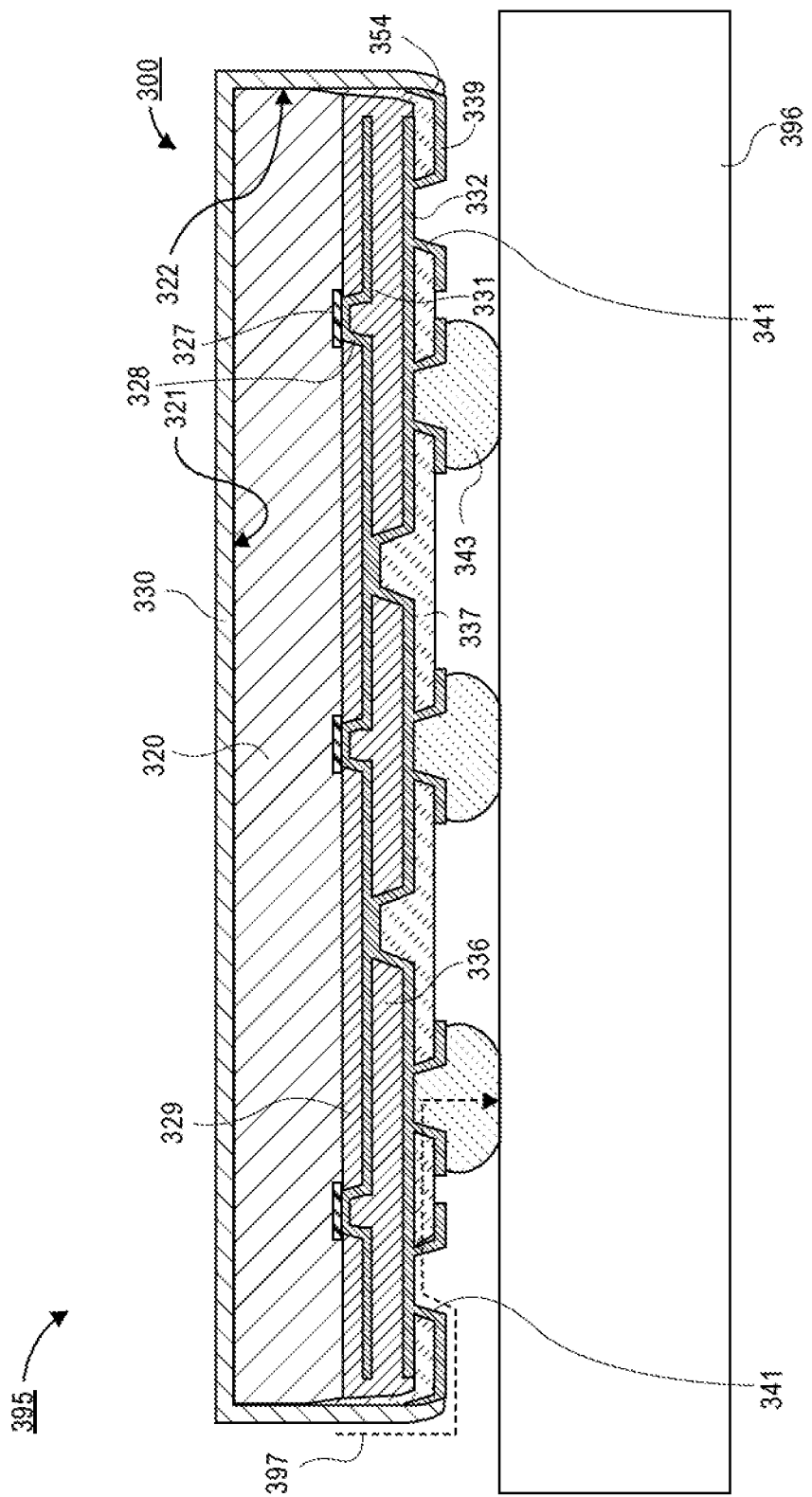
FIG. 3 is a cross-sectional illustration of an electronic system that comprises an electronic package with a grounded conformal shield, in accordance with an embodiment.

Referring now to FIG. 3, a cross-sectional illustration of an electronic system 395 is shown, in accordance with an embodiment. In an embodiment, the electronic system 395 may comprise a WLCSP 300 that is attached to a board 396. For example, the WLCSP 300 may be attached to the board 396 (e.g., a PCB, an interposer, a motherboard, or the like) with interconnects (e.g., solder ball 343, or the like).

In an embodiment, the WLCSP 300 may comprise a die 320 with a redistribution layer comprising a first dielectric layer 329 over pads 327, a first conductive layer 331 over the first dielectric layer 329, and a second conductive layer 332 over a second dielectric layer 336. Vias 328 may electrically couple the first conductive layer 331 to the pads 327. The first conductive layer 331 and the second conductive layer 332 may not extend to the edge of the WLCSP 300. In an embodiment, a conductive path to the edge of the WLCSP 300 may be provided by a third conductive layer 339 (e.g., an under bump ball metallization layer) that is separated from the second conductive layer 332 by a third dielectric layer 337. In an embodiment, a portion 354 of the third conductive layer 339 may wrap around a corner of the WLCSP 300. That is, the portion 354 of the third conductive layer 339 may extend up towards the die 320 proximate to an edge of the WLCSP 300.

In an embodiment, a conductive shield 330 may surround the WLCSP 300. For example, the conductive shield 330 may cover sidewalls 322 and a second surface 321 of the die 320. That is, five sides of the die 320 (i.e., the four sidewalls 322 and the second surface 321 of the die 320) may be covered by the conductive shield 330. In an embodiment, the conductive shield is a conformal shield with a thickness that is between 2 μm and 5 μm. In an embodiment, the conductive shield 330 may be electrically coupled to portion 354 of the third conductive layer 339.

In an embodiment, the conductive shield 330 may be grounded. In a particular embodiment, the conductive shield 330 is grounded via a path through the WLCSP 300. That is, the conductive shield 330 is not directly connected (and grounded) to the board 396. For example, path 397 illustrates an exemplary ground path. As shown, the ground path begins along the conductive shield 330 and continues into the WLCSP via the portion 354 of the third conductive layer 339. From the third conductive layer 339, the path 397 continues (over a via 341) to the second conductive layer 332, and ultimately to a ground ball 343. The ground ball 343 may be electrically coupled to a ground metal in the board 396 (not shown).

Figure 4A:
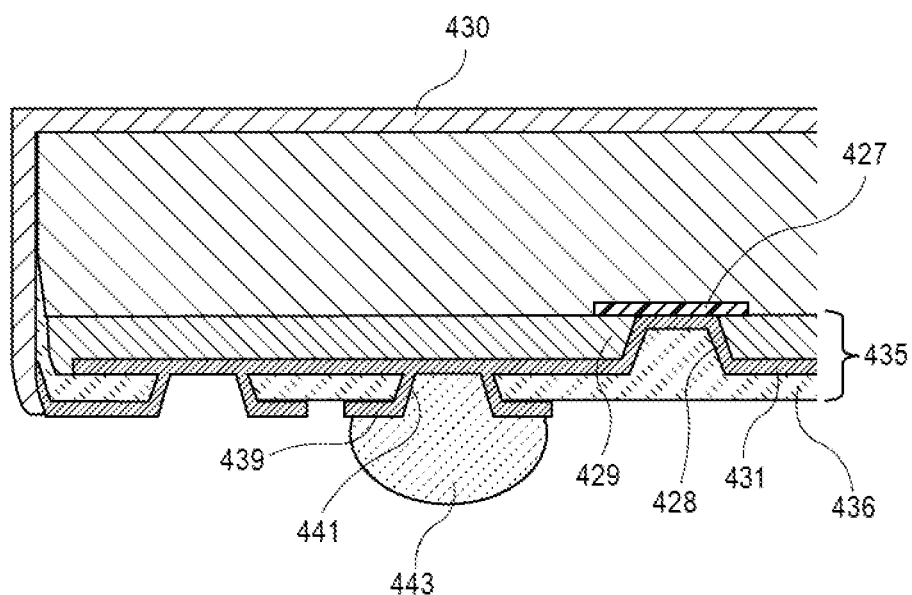
FIG. 4A is a cross-sectional illustration of a WLCSP with a grounded conformal shield, in accordance with an additional embodiment.
Figure 4B:
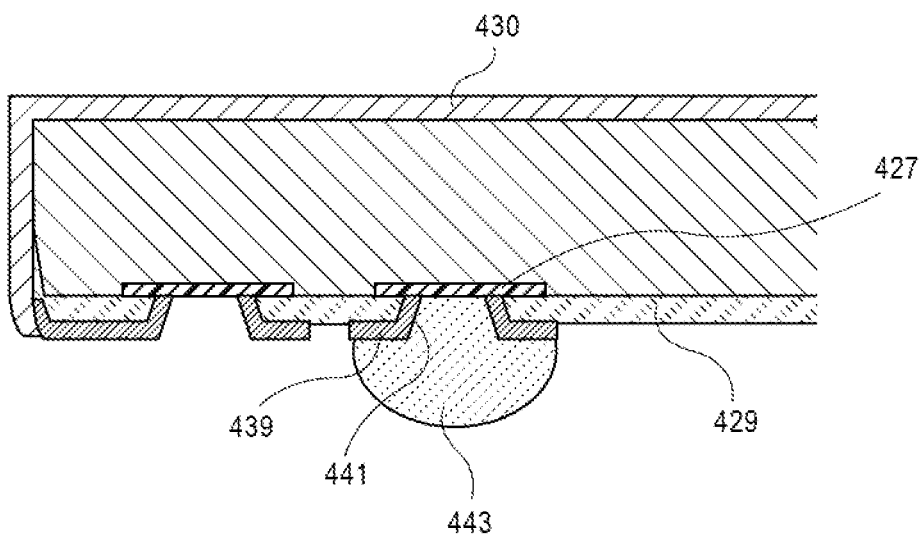
FIG. 4B is a cross-sectional illustration of a WLCSP with a grounded conformal shield, in accordance with an additional embodiment.

Referring now to FIGS. 4A and 4B, cross-sectional illustrations of a portion of a WLCSP in accordance with additional embodiments are shown. Particularly, the embodiments in FIGS. 4A and 4B illustrate that fewer redistribution layers are needed in some embodiments, compared to what is shown above.

Referring now to FIG. 4A, a cross-sectional illustration of a WLCSP with a conductive shield 430 and two conductive layers is shown, in accordance with an embodiment. As shown, the redistribution layer 435 comprises a first dielectric layer 429 over the pad 427, a first conductive layer 431, and a second dielectric layer 436. In an embodiment, a via 428 provides a connection between the pad 427 and the first conductive layer 431, and a via 441 provides a connection between the first conductive layer 431 and an under ball metallization layer 439 with a ball 443.

Referring now to FIG. 4B, a cross-sectional illustration of a WLCSP with a conductive shield 430 and one conductive layer is shown, in accordance with an embodiment. As shown, a single dielectric layer 429 is over the pads 427. Vias 441 may extend through the dielectric layer 429 to provide under ball metallization layer 439 for a ball 443. As shown, the under ball metallization layer 439 may wrap around a corner of the WLCSP to connect to the conductive shield 430.

Figure 5:
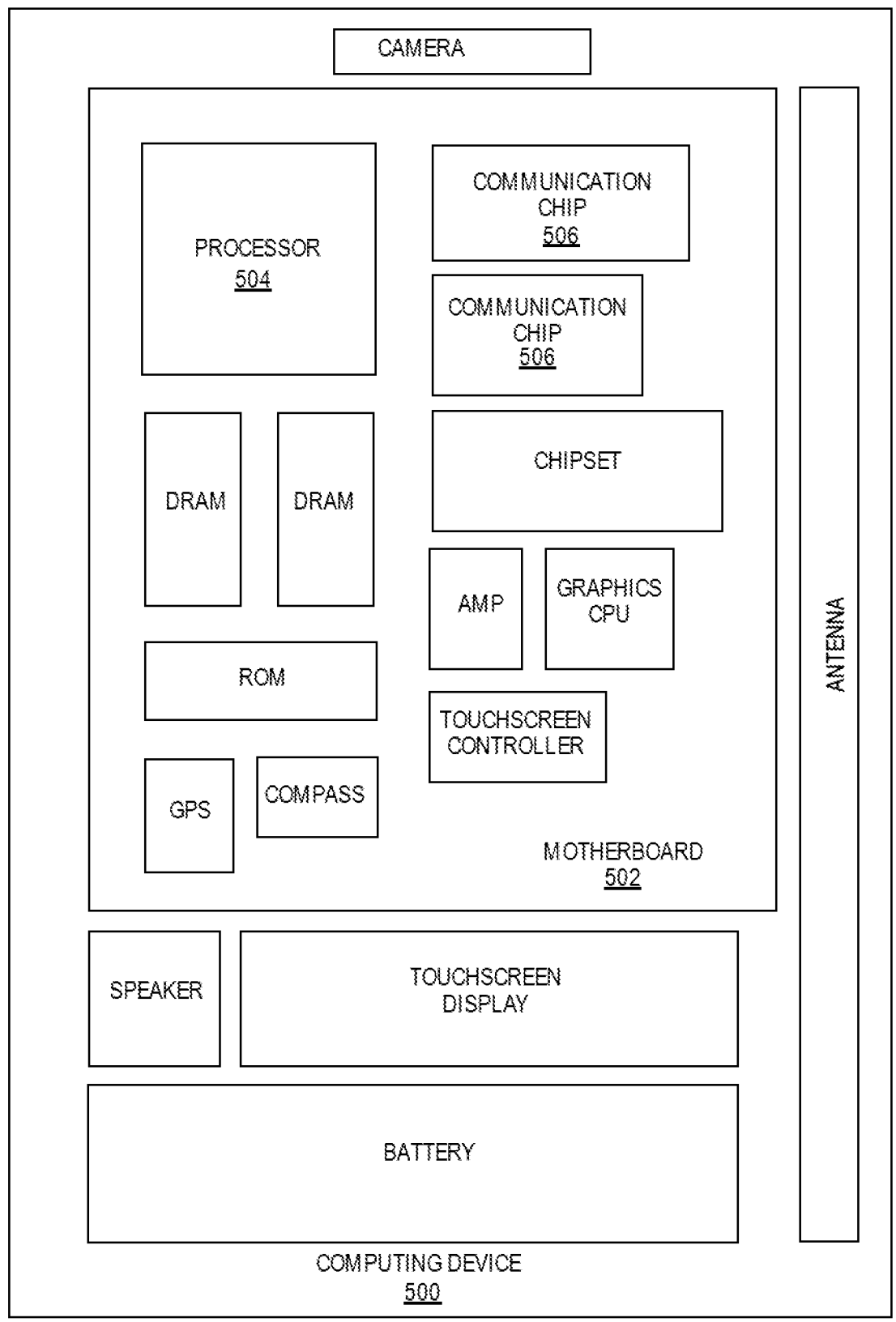
FIG. 5 is a schematic of a computing device built in accordance with an embodiment.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor may be a component of a WLCSP with a grounded conformal shield, in accordance with embodiments described herein. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip may be a component of a WLCSP with a grounded conformal shield, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a die having a first surface, a second surface opposite the first surface, and sidewall surfaces; a redistribution layer over the first surface of the die, wherein the redistribution layer comprises a first conductive layer; an under ball metallization (UBM) layer over the redistribution layer; and a conductive shield over the sidewall surfaces of the die and the second surface of the die, wherein the conductive shield is electrically coupled to the UBM layer.

Example 2: the electronic package of Example 1, wherein an edge of the first conductive layer is spaced away from an edge of the redistribution layer.

Example 3: the electronic package of Example 1 or Example 2, wherein the UBM layer wraps around a corner of the redistribution layer.

Example, 4: the electronic package of Examples 1-3, further comprising: a plurality of balls electrically coupled to the UBM layer.

Example 5: the electronic package of Example 4, wherein the conductive shield is electrically coupled to a ground bump ball by the UBM layer.

Example 6: the electronic package of Examples 1-5, wherein the redistribution layer comprises a first dielectric layer that separates the first conductive layer from the first surface of the die, and a second dielectric layer that separates the first conductive layer from a second conductive layer.

Example 7: the electronic package of Example 6, further comprising: a third dielectric layer between the second conductive layer and the UBM layer.

Example 8: the electronic package of Example 7, wherein a portion of the third dielectric layer extends past a thickness of the first dielectric layer and the second dielectric layer and contacts the die.

Example 9: the electronic package of Example 8, wherein the portion of the third dielectric layer that extends past the thickness of the first dielectric layer and the second dielectric layer and is contacted by the conductive shield.

Example 10: the electronic package of Examples 1-9, wherein the UBM layer comprises a ring, a partial ring, or a plurality of traces.

Example 11: the electronic package of Examples 1-10, wherein a first portion of the conductive shield over the sidewall surfaces of the die has a first thickness, and wherein a second portion of the conductive shield over the second surface of the die has a second thickness that is greater than the first thickness.

Example 12: the electronic package of Examples 1-11, wherein the conductive shield has a curved profile proximate to the UBM layer.

Example 13: the electronic package of Examples 1-12, wherein the electronic package is a wafer-level chip-scale package (WLCSP).

Example 14: a method of forming an electronic package, comprising: forming a redistribution layer over a substrate comprising a first die and a second die, and wherein the redistribution layer comprises: a first dielectric layer over the first die and the second die; and a first conductive layer, wherein the first conductive layer comprises a gap proximate to a boundary between the first die and the second die; forming a first groove through the redistribution layer and into the substrate, wherein the first groove is positioned in the gap; filling the first groove with a second dielectric layer; patterning the second dielectric layer to form a second groove over the first groove; disposing an under ball metallization (UBM) layer over the second dielectric layer, wherein the UBM layer lines the second groove; singulating the first die from the second die along the first groove and the second groove; and disposing a first conductive shield over the first die and a second conductive shield over the second die, wherein the first conductive shield and the second conductive shield contact the UBM layer.

Example 15: the method of Example 14, further comprising: attaching solder balls to the UBM layer prior to singulating the first die from the second die.

Example 16: the method of Example 15, further comprising: applying a protection layer over the solder balls and the UBM layer prior to singulating the first die from the second die.

Example 17: the method of Example 16, further comprising: removing the protection layer after singulating the first die from the second die.

Example 18: the method of Examples 15-17, wherein the first conductive shield and the second conductive shield are electrically coupled to solder balls that are ground balls.

Example 19: the method of Examples 14-18, wherein the first conductive shield and the second conductive shield contact the second dielectric layer.

Example 20: the method of Examples 14-19, further comprising: placing the first die and the second die on a carrier prior to disposing the first conductive shield and the second conductive shield.

Example 21: the method of Examples 14-20, wherein the first conductive shield and the second conductive shield comprise curved profiles proximate to the UBM layer.

Example 22: the method of Examples 14-21, wherein the UBM layer wraps around a corner of the redistribution layer.

Example 23: the electronic system, comprising: a board; a wafer-level chip-scale package (WLCSP) electrically coupled to the board, wherein the WLCSP comprises: a die having a first surface, a second surface opposite the first surface, and sidewall surfaces; a redistribution layer over the first surface of the die, wherein the redistribution layer comprises a first conductive layer, a second conductive layer, a first dielectric layer between the first conductive layer and the first surface of the die, and a second dielectric layer between the first conductive layer and the second conductive layer; an under ball metallization (UBM) layer over the redistribution layer, wherein the UBM layer is separated from the second conductive layer by a third dielectric layer; and a conductive shield over the sidewall surfaces of the die and the second surface of the die, wherein the conductive shield is electrically coupled to the UBM layer.

Example 24: the electronic system of Example 23, wherein the conductive shield comprises a curved profile proximate to the UBM layer.

Example 25: the electronic system of Example 23 or Example 24, wherein a portion of the third dielectric layer extends past a thickness of the first dielectric layer and the second dielectric layer and contacts the die, and wherein the portion of the third dielectric layer that extends past the thickness of the first dielectric layer and the second dielectric layer is contacted by the conductive shield.

What is claimed is:

1. An electronic package, comprising:
a die having a top above a bottom, and a first sidewall and a second sidewall between the top and the bottom, the second sidewall laterally opposite the first sidewall, the bottom of the die having pads thereon;
a first dielectric layer below and on the bottom of the die;
a first conductive layer below and on the first dielectric layer, the first conductive layer electrically coupled to the pads on the bottom of the die;
a second dielectric layer below and on the first conductive layer;
a second conductive layer below and on the second dielectric layer, the second conductive layer coupled to the first conductive layer by vias through the second dielectric layer;
a third dielectric layer below the second conductive layer;
a third conductive layer below and on the third dielectric layer;
solder balls coupled to the third conductive layer; and
a conductive shield over the top of the die, adjacent to the first sidewall of the die, adjacent to the second sidewall of the die, and laterally spaced apart from the solder balls, the conductive shield electrically coupled to the third conductive layer, and the third conductive layer in turn electrically coupled to one of the solder balls.

2. The electronic package of claim 1, wherein the conductive shield is in contact with the first sidewall and the second sidewall of the die.

3. The electronic package of claim 1, wherein the conductive shield is laterally spaced apart from the first sidewall and the second sidewall of the die.

4. The electronic package of claim 3, wherein the third dielectric layer is between the conductive shield and the first sidewall of the die and between the conductive shield and the second sidewall of the die.

5. The electronic package of claim 1, wherein the first dielectric layer is vertically between the bottom of the die and the first conductive layer.

6. The electronic package of claim 1, wherein the first conductive layer is electrically coupled to the pads on the bottom of the die by vias through the first dielectric layer.

7. The electronic package of claim 1, wherein the die comprises silicon.

8. An electronic package, comprising:
a die having a top above a bottom, and a first sidewall and a second sidewall between the top and the bottom, the second sidewall laterally opposite the first sidewall, the bottom of the die having pads thereon;
a first dielectric layer below and in contact with the bottom of the die;
a first conductive layer below and in contact with the first dielectric layer, the first conductive layer electrically coupled to the pads on the bottom of the die;
a second dielectric layer below and in contact with the first conductive layer;
a second conductive layer below and in contact with the second dielectric layer, the second conductive layer coupled to the first conductive layer by vias through the second dielectric layer;
a third dielectric layer below the second conductive layer;
a third conductive layer below and in contact with the third dielectric layer;
solder balls coupled to the third conductive layer; and
a fourth conductive layer, the fourth conductive layer continuous over the top of the die, adjacent to the first sidewall of the die, adjacent to the second sidewall of the die, and laterally spaced apart from the solder balls, the fourth conductive layer electrically coupled to the third conductive layer, and the third conductive layer in turn electrically coupled to one of the solder balls.

9. The electronic package of claim 8, wherein the fourth conductive layer is in contact with the first sidewall and the second sidewall of the die.

10. The electronic package of claim 8, wherein the fourth conductive layer is laterally spaced apart from the first sidewall and the second sidewall of the die.

11. The electronic package of claim 8, wherein the third dielectric layer is between the fourth conductive layer and the first sidewall of the die and between the fourth conductive layer and the second sidewall of the die.

12. The electronic package of claim 8, wherein the first dielectric layer is vertically between the bottom of the die and the first conductive layer.

13. The electronic package of claim 8, wherein the first conductive layer is electrically coupled to the pads on the bottom of the die by vias through the first dielectric layer.

14. An electronic package, comprising:
a die having a top above a bottom, and a first sidewall and a second sidewall between the top and the bottom, the second sidewall laterally opposite the first sidewall, the bottom of the die having pads thereon;
a first dielectric layer below and in contact with the bottom of the die;
a first conductive layer below and in contact with the first dielectric layer, the first conductive layer electrically coupled to the pads on the bottom of the die;
a second dielectric layer below the first conductive layer;
a second conductive layer below and in contact with the second dielectric layer;
a third dielectric layer below and in contact with the second conductive layer;
a third conductive layer below and in contact with the third dielectric layer, the third conductive layer coupled to the second conductive layer by vias through the third dielectric layer;
solder balls coupled to the third conductive layer; and
a conductive shield over the top of the die, adjacent to the first sidewall of the die, adjacent to the second sidewall of the die, and laterally spaced apart from the solder balls, the conductive shield electrically coupled to the third conductive layer, and the third conductive layer in turn electrically coupled to one of the solder balls.

15. The electronic package of claim 14, wherein the conductive shield is in contact with the first sidewall and the second sidewall of the die.

16. The electronic package of claim 14, wherein the conductive shield is laterally spaced apart from the first sidewall and the second sidewall of the die.

17. The electronic package of claim 16, wherein the third dielectric layer is between the conductive shield and the first sidewall of the die and between the conductive shield and the second sidewall of the die.

18. The electronic package of claim 14, wherein the first dielectric layer is vertically between the bottom of the die and the first conductive layer.

19. The electronic package of claim 14, wherein the first conductive layer is electrically coupled to the pads on the bottom of the die by vias through the first dielectric layer.

20. The electronic package of claim 14, wherein the die comprises silicon.

* * * * *